(12) United States Patent
Perner

(10) Patent No.: US 6,636,436 B2
(45) Date of Patent: Oct. 21, 2003

(54) ISOLATION OF MEMORY CELLS IN CROSS POINT ARRAYS

(75) Inventor: Frederick A. Perner, Palo Alto, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 87 days.

(21) Appl. No.: 09/983,701

(22) Filed: Oct. 25, 2001

(65) Prior Publication Data

US 2003/0081452 A1 May 1, 2003

(51) Int. Cl.⁷ .......................... G11C 11/00; H01L 21/00
(52) U.S. Cl. ...................... 365/158; 365/171; 365/173; 257/295
(58) Field of Search ............................... 365/158, 171, 365/173; 257/295, 421, 422, 659

(56) References Cited

U.S. PATENT DOCUMENTS

| | | | | |
|---|---|---|---|---|
| 5,659,499 A | * | 8/1997 | Chen et al. | 365/158 |
| 5,940,319 A | * | 8/1999 | Durlam et al. | 365/171 |
| 6,351,408 B1 | * | 2/2002 | Schwarzl et al. | 365/158 |
| 6,538,297 B2 | * | 3/2003 | Odagawa et al. | 257/421 |
| 6,555,858 B1 | * | 4/2003 | Jones et al. | 257/295 |

FOREIGN PATENT DOCUMENTS

EP 1109169 A2 6/2001

\* cited by examiner

*Primary Examiner*—Son T. Dinh

(57) ABSTRACT

A memory array includes memory cells located at cross points of first and second conductors. The memory cells are compound structures including an isolation element for isolating a memory cell from sneak path currents, and a re-writeable storage element for storing a binary state of the memory cell. The isolation elements include tunnel gate surface effect transistor gate oxides, and pillar diode structures. A control gate of the transistor disconnects the tunnel junction from sidewalls of the pillar, preventing sneak path current flow through the memory cells. The isolation elements in the memory cells do not require additional space on the substrate, allowing for a high array density. In addition, the memory cells have a low forward voltage drop, improving the readability of the memory array.

16 Claims, 15 Drawing Sheets

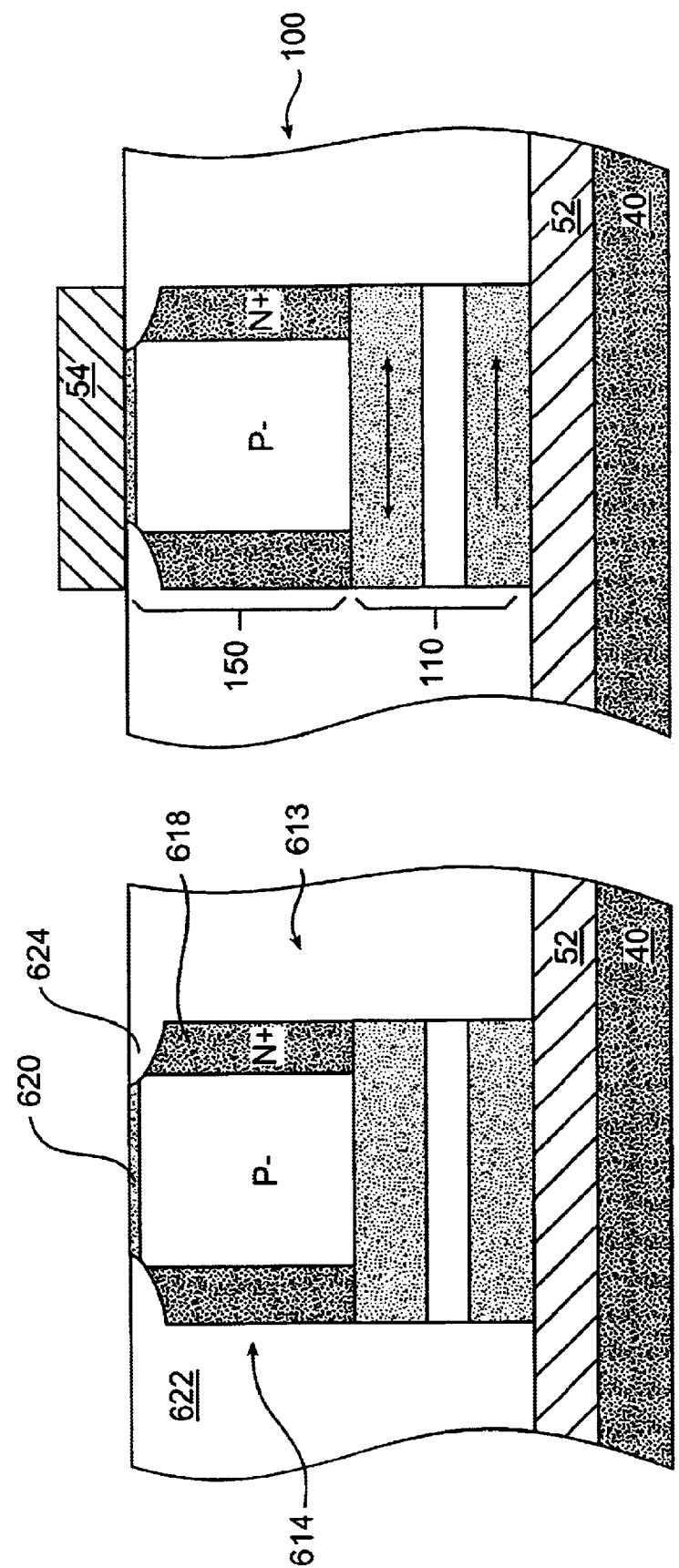

ISOLATION OF MEMORY CELLS IN CROSS POINT ARRAYS

RELATED APPLICATION

The following application of the common assignee may contain some common disclosure and may relate to the invention:

U.S. patent application Ser. No. 09/912,565, entitled "ISOLATION OF MEMORY CELLS IN CROSS POINT ARRAYS,".

TECHNICAL FIELD

The technical field is memory cells for cross point memory arrays. More specifically, the technical field is memory cells having an isolation feature built into the memory cells.

BACKGROUND

Cross point memory arrays include horizontal word lines that cross vertical bit lines. Memory cells are located at the cross points of the word and bit lines, and function as the storage elements of a memory array. The memory cells each store a binary state of either "1" or "0." Memory devices typically include one time programmable (OTP) or re-programmable memory cells. A re-programmable memory cell can be switched among binary states. An OTP memory cell's state is permanent once the cell is programmed. Re-programmable memory cells are desirable because they can be reprogrammed after sale and can be used in random access memory devices.

One type of re-programmable memory device is magnetic random access memory (MRAM). FIG. 1 illustrates a conventional MRAM memory array 10 having resistive memory cells 12 located at cross points of word lines 14 and bit lines 16. The word lines 14 extend horizontally along rows of the memory array 10, and the bit lines 16 extend vertically along columns of the memory array 10.

FIG. 2 illustrates a conventional MRAM memory cell 12. The memory cell 12 may be a spin dependent tunneling ("SDT") device. The memory cell 12 includes a pinned ferro-magnetic layer 24 and a free ferro-magnetic layer 18. The pinned layer 24 has a magnetization that has a fixed orientation, illustrated by the arrow 26. The magnetization of the free layer 18, illustrated by the bidirectional arrow 28, can be oriented in either of two directions along an "easy axis" of the free layer 18. If the magnetizations of the free layer 18 and the pinned layer 24 are in the same direction, the orientation of the memory cell 12 is "parallel." If the magnetizations are in opposite directions, the orientation is "anti-parallel." The two orientations correspond to the binary states of "1" and "0," respectively.

The free layer 18 and the pinned layer 24 are separated by an insulating tunnel barrier layer 20. The insulating tunnel barrier layer 20 allows quantum mechanical tunneling to occur between the free layer 18 and the pinned layer 24. The tunneling is electron spin dependent, making the resistance of the memory cell 12 a function of the relative orientations of the magnetizations of the free layer 18 and the pinned layer 24. The resistance of the memory cell 12 may have a "low" value of R if the orientation is parallel, and a "high" value of R+ΔR if the orientation is anti-parallel.

Each memory cell 12 in the memory array 10 can have its binary state changed by a write operation. Write currents supplied to the word line 14 and the bit line 16 crossing at a specific memory cell 12 switch the magnetization of the free layer 18 between parallel and anti-parallel with respect to the pinned layer 24. A current Iy passing through the bit line 16 results in the magnetic field Hx. A similar magnetic field Hy is created when a current Ix passes through the word line 14. The magnetic fields Hx and Hy combine to switch the magnetic orientation of the memory cell 12. The change in resistance due to the changing memory cell magnetization is readable to determine the binary state of the memory cell 12.

As illustrated in FIG. 1, a cross point memory array may have all memory cells connected together as one large parallel circuit. Ideally, current passes only through a selected memory cell during a read operation. However, in a large parallel circuit memory array, currents flow through unselected memory elements during read operations. These currents are referred to as "sneak path currents." If the cross point memory array has a high density of memory cells, neighboring memory cells must be isolated from one another so that a selected memory cell is not affected by sneak path currents during a read operation.

Conventional parallel-connected cross point arrays often include a control device in series with each memory cell to prevent sneak path currents. One conventional control device is a series MOS transistor located in a memory cell. The series MOS transistor is controlled by an additional conductor run in parallel with the word line. The series MOS transistor isolates the selected memory cell from unselected memory cells in the memory array by breaking parallel connections of memory cells. During read operations, only the MOS transistor in the selected memory cell is turned on. The MOS transistors in unselected cells are turned off, thereby preventing sneak path currents from flowing through unselected memory cells.

A disadvantage to MOS transistors is that they consume valuable substrate area, and the memory cells must be larger in order to accommodate electrical contacts from the memory cell to the substrate. In addition, MOS transistors require a control gate and a complex physical structure for implementation in a thin film memory system.

Another way to prevent sneak path currents is to place a diode in series with each memory element in an array. The series diode may be a single crystal diode located in the substrate, or a thin film diode located in the plane with the memory elements. The series diode isolates the memory cells, but the associated diode forward voltage drops can be large in conventional devices. Large forward voltage drops are undesirable because they negatively affect the ability to read and write data in the memory cells. In addition, leakage currents are relatively high in conventional diode devices, which also negatively affects the ability to read and write data.

A need therefore exists for a memory array having an isolation capability that does not occupy substrate area, and that does not negatively affect the ability to read or write to the memory array.

SUMMARY

According to a first aspect, a memory array includes memory cells located at cross points of first and second conductors. The memory cells include an isolation element in series with a re-writeable storage element. The storage element stores a binary state of the memory cell, and the isolation element isolates the memory cell in the memory array. The isolation elements include a pillar structure with an N+ region surrounding a P− region, and a gate oxide disposed at an end of the pillar. Each isolation element functions as a transistor, where the transistor can disconnect the tunnel junction from sidewalls of the pillar, preventing current flow through the memory cell.

According to the first aspect, the isolation elements provide an isolation feature to the memory cells that does not occupy space in the substrate. This allows more memory cells to be placed on the substrate, increasing array density.

In addition, the memory cells have a low forward voltage drop. Low forward voltage drops enhance the ability to sense the binary states of the memory cells, improving the ability to read the memory array. The isolation elements also allow low leakage currents.

According to a second aspect, the memory array can be manufactured using low temperature processes.

According to the second aspect, a multi-plane memory array can be formed from stacked memory arrays. The multi-plane memory array is a high density memory device.

Other aspects and advantages will become apparent from the following detailed description, taken in conjunction with the accompanying figures.

BRIEF DESCRIPTION OF THE FIGURES

The detailed description will refer to the following figures wherein like reference numerals refer to like elements and wherein:

FIGS. 10–13 illustrate a method of making a cross point memory array according to the memory cell embodiment illustrated in FIGS. 5A and 5B;

DETAILED DESCRIPTION

A memory array with memory cells having an isolation element and a storage element will be discussed by way of preferred embodiments and by way of the figures.

Figure 3:
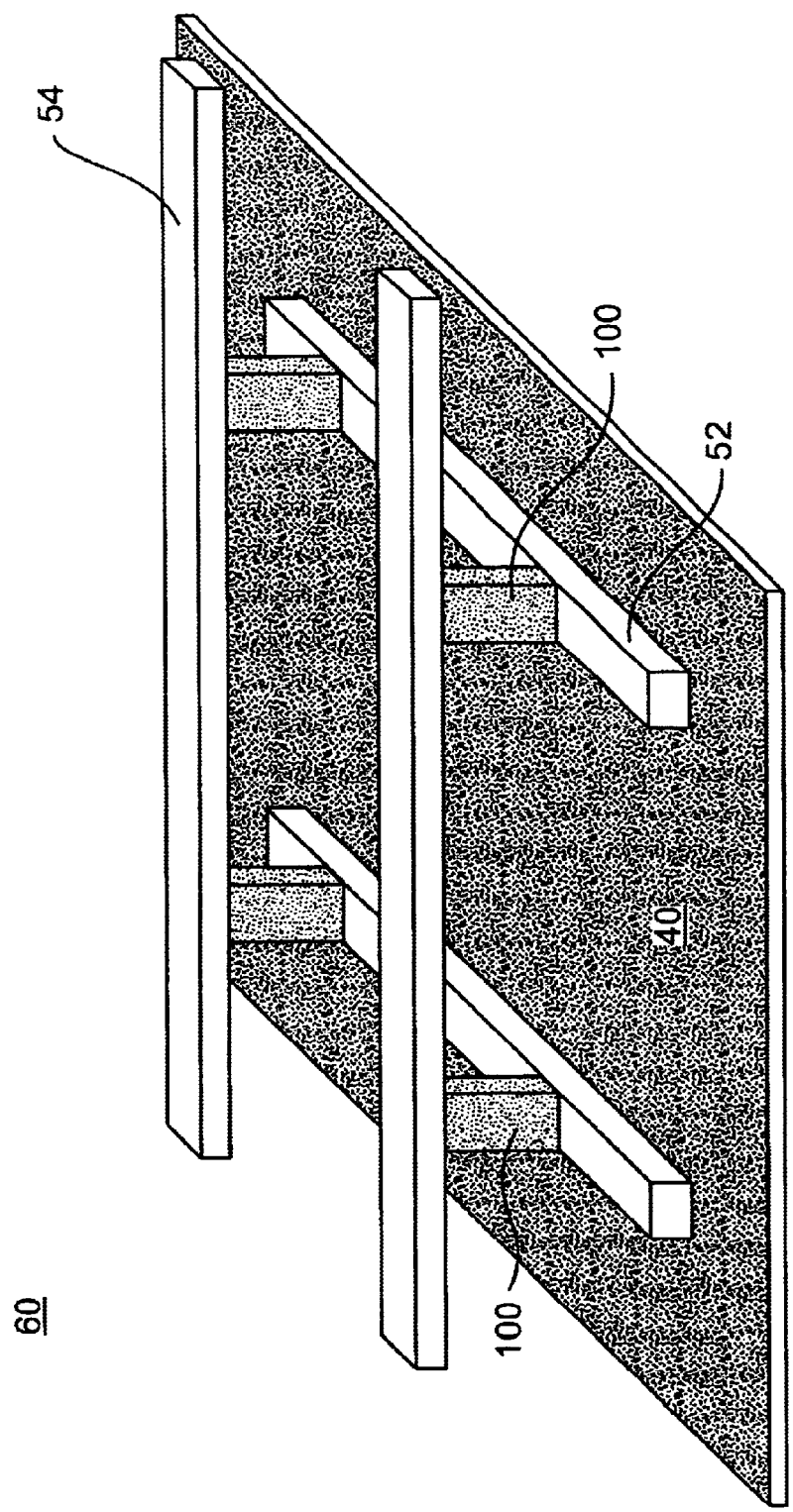
FIG. 3 is a perspective view of a memory array according to an embodiment.

FIG. 3 is a perspective view of a memory array 60. The memory array 60 includes memory cells 100 located at crossing points of row conductors 52 and column conductors 54. The row conductors 52 are disposed over a substrate 40. The row conductors 52 and the column conductors 54 convey currents for changing the binary state of the memory cells 100 during write operations, and for reading the binary state of the memory cells 100 during read operations. The memory cells 100 may include, for example, MRAM memory cells. In FIG. 3, two rows of row conductors 52 and two columns of column conductors 54, intersecting at four memory cells 100, are shown for the purposes of illustration. In practice, arrays of 1024×1024 memory cells and larger, for example, may be used.

Figure 1:
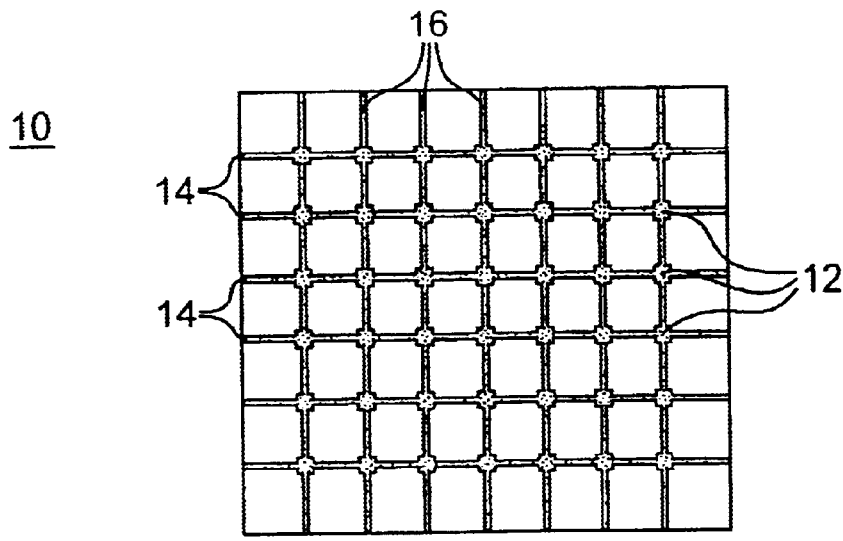
FIG. 1 is a schematic view of a conventional MRAM memory array.
Figure 2:
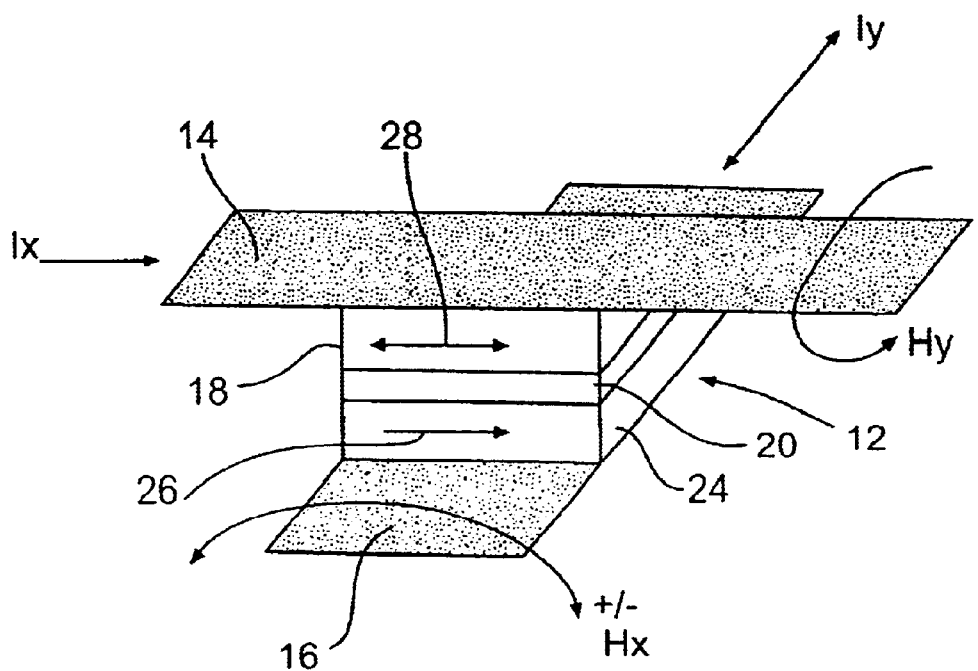
FIG. 2 illustrates a conventional MRAM memory cell.
Figure 4:
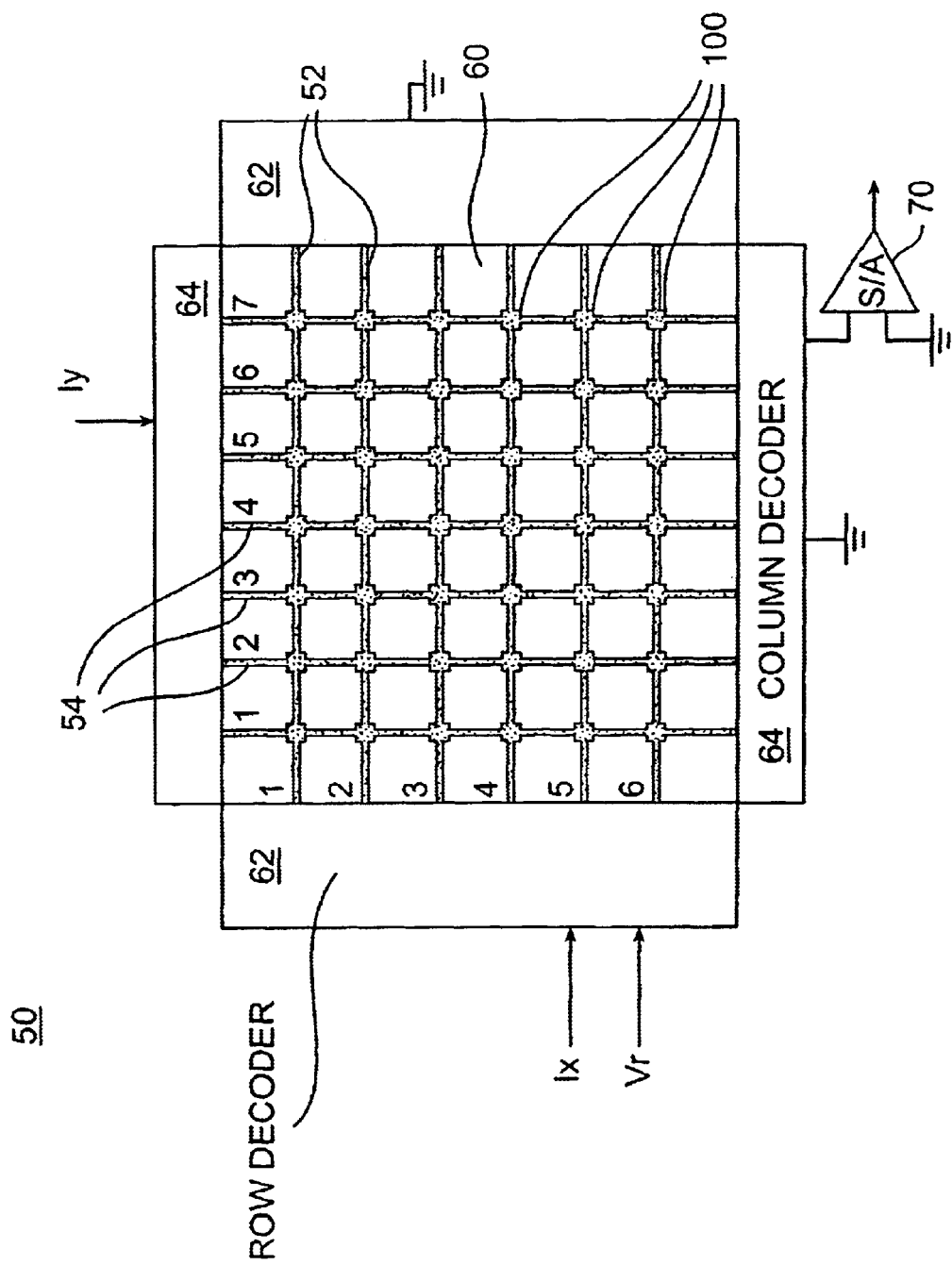
FIG. 4 is a schematic view of a memory device including a memory array as illustrated in FIG. 3.

FIG. 4 is a schematic view of a memory device 50 including a memory array 60 as illustrated in FIG. 1, and associated read/write circuitry. The memory device 50 comprises the memory array 60, a row decoder 62 coupled to rows 1–6 of the memory array 60 to select among the 6 rows, a column decoder 64 coupled to columns 1–7 of the memory array 60 to select among the 7 rows, and a sense amplifier 70 for detecting a binary state of the memory cells 100 during read operations.

The row decoder 62 can include a plurality of switches on either side of the row conductors 52 for selectively applying a write current Ix or a read potential Vr to rows containing a selected memory cell 100, and for coupling the column conductors 52 to ground. Similarly, the column decoder 64 can include a plurality of switches on either side of the column conductors 54 for selectively applying a write current Iy during a write operation, or to couple a selected column conductor 54 to the sense amplifier 70 during a read operation.

Figure 5A:
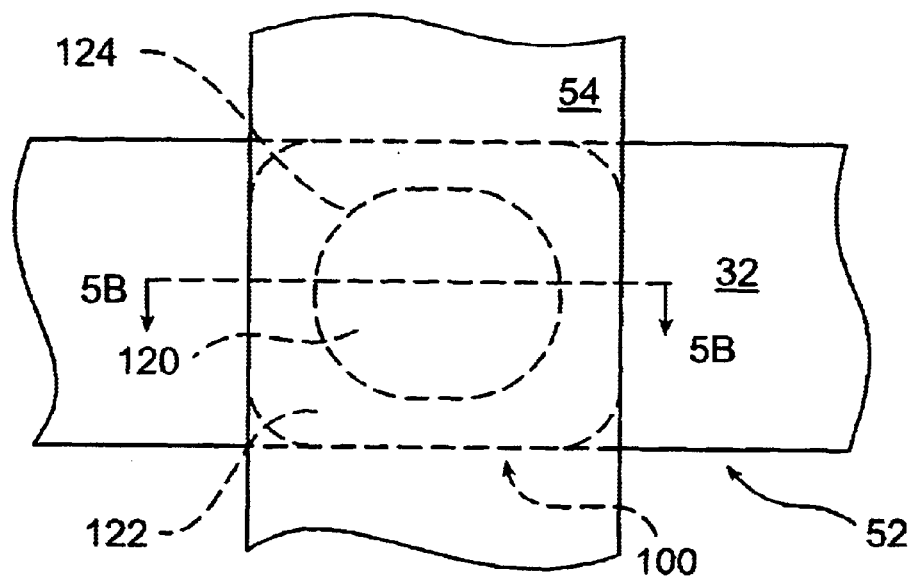
FIG. 5A is a top plan view of a first embodiment of a memory cell located at a cross point of a row conductor and a column conductor.
Figure 5B:
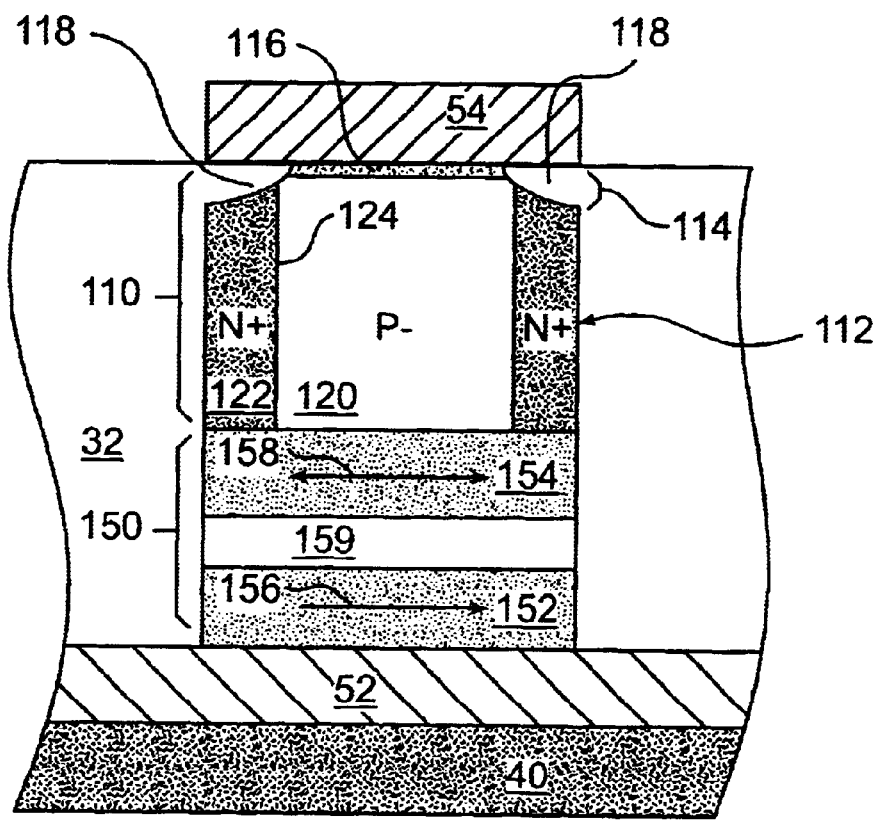
FIG. 5B is a cross sectional view of the memory cell illustrated in FIG. 5A, taken on line 5B—5B, including the structure surrounding the memory cell in a cross point memory array.

FIG. 5A is a top plan view of a portion of the memory array 60 illustrating a memory cell 100 located at a cross point of a row conductor 52 and a column conductor 54. FIG. 5B is a cross sectional view of the memory cell 100 illustrated in FIG. 5A taken on line 5B—5B, and the structure surrounding the memory cell 100 in the memory array 60.

The memory cell 100 is supported on a row conductor 52, and the row conductor 52 is supported on the substrate 40. The column conductor 54 is coupled to the memory cell 100, and extends orthogonally to the row conductor 52. The memory cell 100 comprises an isolation element 110 and a storage element 150 in series with the isolation element 110. The isolation element 110 serves to isolate the memory cells from sneak paths during read and write operations, and the storage element 150 stores the binary state, or "bit," of the memory cell 100. The memory cells 100 in the memory array 60 can be embedded in an insulator 32. The insulator 32 may extend along the length of the row conductor 52 and the column conductor 54.

The storage element 150 can be a re-writeable storage element, such as, for example, a magnetic random access memory (MRAM) storage element. The storage element 150 illustrated in FIG. 5B includes a pinned layer 152 and a free layer 154. The pinned layer 152 has a magnetization of a fixed orientation, illustrated by the arrow 156. The magnetization of the free layer 154, illustrated by the bidirectional arrow 158, can be oriented in either of two directions along an easy axis of the free layer 154. If the magnetizations of the free layer 154 and the pinned layer 152 are in the same direction, the state of the memory cell 100 is parallel. If the magnetizations are in opposite directions, the state is anti-parallel. The resistance of the storage element 150 depends on the parallel and anti-parallel states, which may correspond to the binary states of "1" and "0," respectively.

The free layer 154 and the pinned layer 152 are separated by an insulator 159. The insulator 159 serves as an insulating tunnel barrier layer between the free layer 154 and the pinned layer 152. The insulating tunnel barrier layer 159 allows quantum mechanical tunneling to occur between the free layer 154 and the pinned layer 152.

The isolation element 110 isolates the memory cell 100 from sneak path currents. The isolation element 110 acts as a tunnel gate transistor having a threshold voltage Vth that allows current to pass through a selected memory cell 100 when the read voltage Vr is applied to the memory cell 100. In addition, the threshold voltage Vth of the isolation element is high enough so that leakage currents do not pass through the memory cell 100. The isolation element 110 is discussed in further detail below.

The isolation element 110 comprises a pillar 112 and a gate oxide 114. The pillar 112 can be considered to be "vertically" oriented, because a PN junction of the pillar extends perpendicularly to the surface of the substrate 40. The gate oxide 114 functions as a control gate for the transistor isolation element 110. The gate oxide 114 comprises a thin tunnel junction (TTJ) layer 116 formed over a P− core region 120 of the pillar 112, and an outer region 118 generally located over an N+ region 122 of the pillar 112. The TTJ 116 can be, for example, a dielectric material formed over the P− core region 120, and the outer region 118 can be, for example, a dielectric material formed over the N+ region 122 having a lower dielectric constant than the TTJ 116. The outer region 118 can also be a gap filled with a gas, gases, or a void. The outer region 118 may include a different dielectric material that may have a lower dielectric constant than the TTJ 116, so that tunneling currents can be limited to the TTJ 116 disposed over the P− core region 120. The inclusion of the outer region 118 reduces parasitic tunnel currents through the isolation element 110, which reduces leakage currents through the isolation element 110.

The TTJs 116 in the memory array 60 control the flow of tunnel currents from the column conductors 54 to the surfaces of the pillars 112 in the memory cells 100. A tunnel current can occur as a result of a read voltage Vr being applied to a row conductor 52 in the memory array 60. The TTJ 116 is a tunnel junction for the gate oxide 114, and currents used to read the binary state of the memory cell 100 pass through the gate oxide 114. There is preferably no lateral conduction in the TTJ 116.

The pillar 112 includes the P− core region 120 and the N+ region 122 surrounding the P− core region 120. The pillar 112 therefore has a diode structure. The pillar 112 may have the shape of, for example, a generally rectangular post with rounded edges. The pillar 112 may also have, for example, a square or a round cross section. The pillar 112, and the storage element 150 may also have a rectangular cross section of varying aspect ratio, in order to provide a desired orientation for the magnetizations 156, 158 of the layers 152, 154.

A PN junction 124 is formed at the boundary between the N+ region 122 and the P− core region 120. The cross section of the pillar 112 should be small enough so that the P− region 120 can be fully depleted with a zero voltage bias across the PN junction 124. The pillar 112 may be formed from, for example, a single crystal silicon grown from the substrate, an amorphous silicon post, or a polysilicon post. A center region of the pillar 112 may be fully depleted, and the sidewalls doped with an N-dopant to form the N+ region 122.

Figure 6:
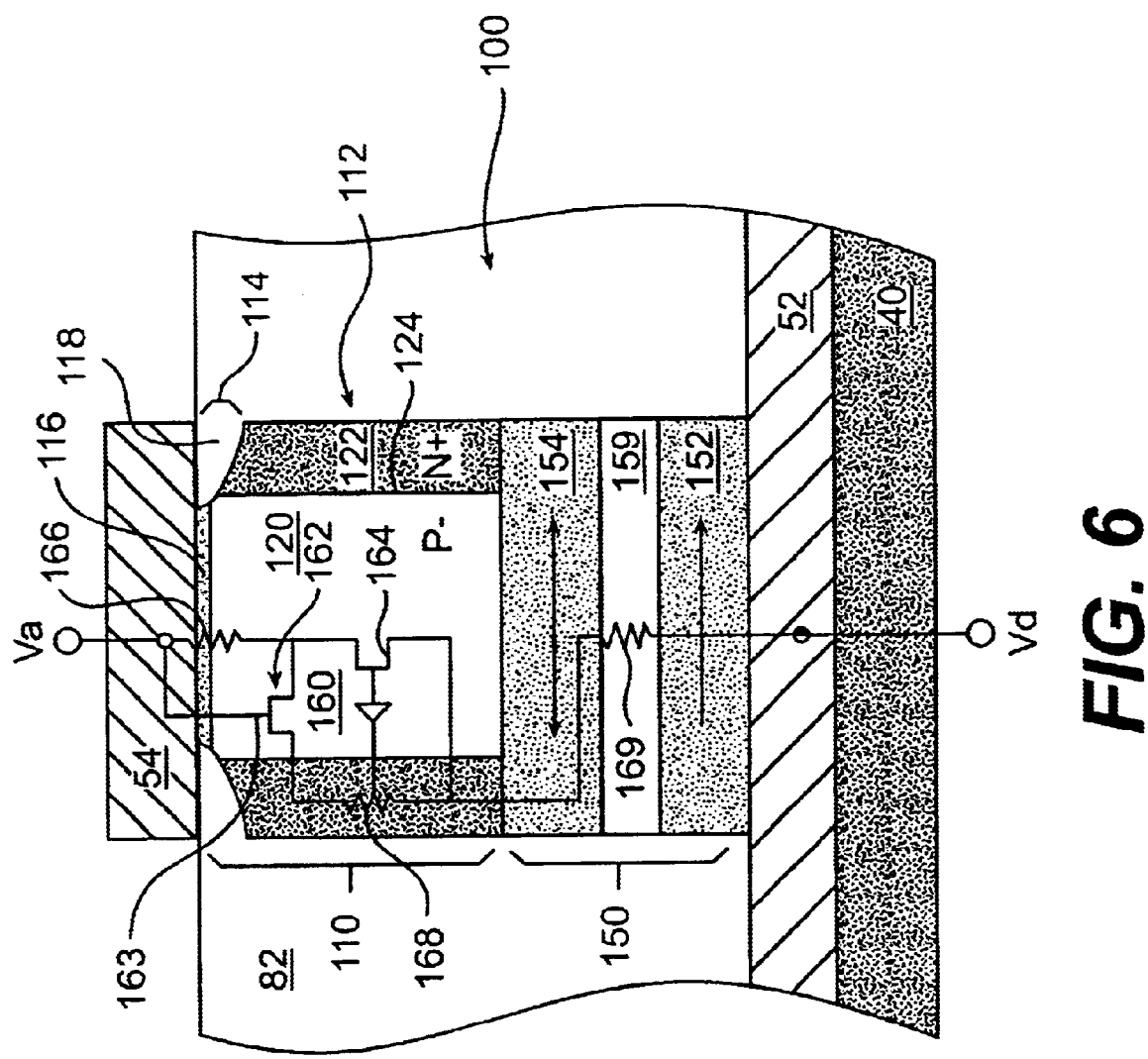
FIG. 6 is a cross sectional view of the memory cell illustrated in FIG. 5A, taken on line 5B—5B, with an equivalent circuit superimposed on the memory cell.

FIG. 6 is a cross sectional view of the memory cell 100 illustrated in FIG. 5A taken on line 5B—5B, with an equivalent circuit 160 superimposed thereon. The equivalent circuit 160 is included in FIG. 6 to illustrate the isolation capabilities of the memory cell 100. In FIG. 6, the row conductor 52 is coupled to a voltage Vd, and the column conductor 54 is coupled to a voltage Va. The voltages Vd and Va represent voltages applied to the memory cell 100.

The equivalent circuit 160 is a symbolic representation of the functions of the various elements of the memory cell 100. The equivalent circuit 160 comprises an NMOS transistor 162, an NMOS transistor control gate 163, a JFET 164, a TTJ resistance 166, an N+ region resistance 168, and a storage element resistance 169. The surface of the pillar 112, along with a control gate 163 and the N+ region 122 at the periphery of the pillar 112, forms the NMOS transistor 162.

The TTJ 116 corresponds to the control gate 163 of the NMOS transistor 162. The NMOS transistor control gate 163 can be generally referred to as "horizontally" oriented because current flows horizontally along the surface of the pillar 112 beneath the control gate 163, from the center of the pillar 112 to the edge of the pillar 112. The gate oxide 114 therefore acts as a control gate for a tunnel gate surface effect transistor.

The center region of the TTJ 116 also corresponds to the drain of the NMOS transistor 162. There is no diffused drain region under the TTJ 116, so the drain of the NMOS transistor 162 is a virtual drain at the center of the TTJ 116. The tunnel current through the TTJ 116 injects current into a channel region of the NMOS transistor 162, as would a physical drain junction in a conventional NMOS transistor. The source of the NMOS transistor 162 is the N+ region 122 surrounding the P− core region 120. The TTJ resistance 166 represents the resistance of the TTJ 116.

The JFET 164 corresponds to the P− region 120 and the N+ region 122 of the pillar 112. The source of the JFET 164 corresponds to the electrical contact of the bottom of the P− region 120 with the free layer 154. The drain of the JFET 164 corresponds to an NMOS channel region at the top of the P− region 120. The gate of the JFET 164 corresponds to the N+ diffused region 122. The JFET 164 can be generally referred to as "vertically" oriented, because the PN junction 124 extends perpendicularly to the surface of the substrate 40, through the pillar 12.

The pillar 112 functions as a vertical enhancement mode JFET. Specifically, the electrical connection of the JFET gate to the JFET source in the enhancement mode JFET 164 maintains the P− region 120 depleted of carriers. The N+ region resistance 168 represents the resistance of the N+ region 122.

The enhancement mode JFET 164 has a zero gate-to-source bias, and the JFET 164 is in a non-conduction mode of operation. A non-conduction mode means that the P− core region 120 of the JFET 164 is fully depleted. With the core of the pillar 112 fully depleted, current will flow through the TTJ resistance 166 only if the surface of the pillar 112 can be inverted (i.e., only if a conducting channel is formed). The surface of the pillar 112, along with the control gate 163 and the N+ region 122 at the periphery of the pillar 112, forms the NMOS transistor 162. The surface of the pillar 112 will become inverted if the voltage Va–Vd applied between the column conductor 54 and the row conductor 52 is greater than the threshold voltage Vth of the NMOS transistor control gate 163.

If the voltage Va–Vd applied to the column conductor 54 is greater than a threshold voltage Vth of the NMOS transistor control gate 163, an accumulation layer forms under the TTJ 116. A tunnel current will then flow through the TTJ 116 into the channel region (i.e., the accumulation layer) of the NMOS transistor control gate 163. The accumulation layer also connects the entire top surface of the pillar 112 to the N+ region 122 of the JFET 164. The result is a current that flows from the column conductor 54, through the TTJ 116, laterally through the accumulation layer at the top of the P– region 120, and vertically through the N+ region 122 of the pillar 112 to the row conductor 52. The magnitude of the current in part depends on the magnitude of the applied voltage Va–Vd across the memory cell 100, and the effective resistance 166 of the TTJ 116.

The value of the threshold voltage Vth is selected to control sneak path currents through the memory cell 100. A read voltage Vr is selected to exceed the threshold voltage Vth so that a resistance of the memory cell 100 can be determined during a read operation. If the read voltage Vr is less than the threshold voltage Vth, the current through the TTJ 116 is limited to the low leakage current of the surface NMOS transistor 160. The isolation element 110 therefore permits reading of the memory cell 100 while isolating the memory cell 100 from sneak path currents.

The TTJ 116 is thin enough to ensure that an accumulated layer forms on the top surface of the pillar 112 when Vr is greater than Vth, and the TTJ 116 may therefore pass a sense current for reading the binary state of the memory cell 100. The outer region 118 can be filled with a dielectric material or a void sufficient to prevent significant tunnel current through the outer region 118 of the gate oxide 114. The process of sensing data from the memory cell 100 is therefore focused at the TTJ 116 of the memory cell 100.

Advantageously, the NMOS and JFET features in the memory cells 100 provide the isolation feature to prevent sneak path currents through the memory array 60. The memory cell 100 is therefore a compound structure that combines an isolation element and a storage element. The resulting structure advantageously has a lower forward voltage drop than a memory element with a series diode control element. A lower forward voltage drop is advantageous because high voltage drops across memory cells degrade the ability to sense the resistance of the memory cells.

As another advantage, the memory cells 100 incorporate an isolation feature without occupying substrate area, unlike series MOS transistor control elements. This allows for higher array densities.

The memory cell 100 also has a high reverse resistance (lower reverse leakage current) because in a reverse mode, or "blocking" mode, the voltage (Va–Vd) applied to the memory cell 100 is less than the threshold voltage Vth of the NMOS transistor 162. When the gate voltage of an NMOS transistor 162 is less than the threshold voltage Vth, the channel of the NMOS transistor 162 remains inverted (i.e., not accumulated), and when the channel is inverted, no current will flow from the drain to the source. When Va–Vd is less than Vth, the top surface of the pillar 112 is not accumulated (remains depleted), and has a high resistance. The conduction properties of the memory cell 100 are set according to the NMOS transistor 162 channel length and width, the mobility of electrons in the surface accumulation layer, and the threshold voltage Vth. In the memory cell 100, the channel length is the distance from the center of the pillar 112 to the PN junction 124 at the edge of the pillar 112. The reverse conduction parameters are primarily set by the threshold voltage Vth, and are generally superior to a horizontally arranged PN diode of similar size.

The reverse conduction parameters of the memory cell are advantageous because reverse leakage current in semiconductor devices is primarily determined by surface conduction, and a conventional PN diode requires special surface treatments that are impractical in a pillar vertical diode. By contrast, an NMOS device controls the conduction surface according to the gate voltage. The NMOS device therefore has an intrinsically lower leakage current.

PN diodes also have a heavily doped PN junction in order to achieve a low forward voltage drop. Junctions formed from highly doped P and N regions have relatively large reverse leakage currents, greater than in NMOS transistor structures as described in this specification.

A write operation for programming a selected memory cell 100 will now be discussed with reference to FIGS. 4 and 6. The write operation is described with reference to memory cells 100, however the process described is appropriate for a memory device 50 employing alternative memory cell embodiments described in this specification.

A selected memory cell 100 is written to, or programmed, by supplying the write current Ix to the row conductor 52 crossing the selected memory cell 100, and by supplying the write current Iy to the column conductor 54 crossing the selected memory cell 100. A current Iy passing through the column conductor 52 results in a magnetic field Hx (not shown), and a similar magnetic field Hy is created when a current Ix passes through the row conductor 52. The magnetic fields Hx and Hy combine to switch the magnetic orientation of the selected memory cell 100. If the memory cell 100 is in a low resistance, parallel state, Ix and Iy can be used to switch the orientation of the memory cell 100 to a high resistance, anti-parallel state. If the memory cell 100 is in an anti-parallel state, the currents Ix and –Iy can be used to switch the orientation to the parallel state. The change in resistance due to the changing memory cell magnetization is readable to determine the binary state of the memory cell 100.

A read operation for the memory array 60 will be discussed with reference to FIGS. 4 and 6. The memory device 50 can advantageously employ an equipotential read process, as disclosed in U.S. Pat. No. 6,259,644 to Tran et al., the contents of which are hereby incorporated by reference. An equipotential read process is outlined below with reference to memory cells 100, however the process described is appropriate for a memory device 50 employing alternative memory cell embodiments described in this specification.

In order to determine a binary state of (i.e., to read) a selected memory cell 100, a read potential Vr is applied to the row conductor 52 crossing the selected memory cell 100, via the row decoder 62. The column conductor 54 crossing the selected memory cell 100 is coupled to the sense amplifier 70, via the column decoder 64. The sense amplifier 70 can be at virtual ground, so that the voltage across the selected memory cell 100 is Vr. The voltage Vr is chosen to exceed the threshold voltage Vth of the NMOS transistor 162 (illustrated in FIG. 6).

An equal potential that is approximately equal to the virtual ground potential applied to the selected column 54 by the sense amplifier 70 can be applied to all other column conductors 54 in the memory array 60. The sense amplifier 70 senses the current from the selected column conductor 54 to determine the binary state of the selected memory cell 100. The binary state may be detected by a processing device (not shown) coupled to an output from the sense amplifier 70, the output of the sense amplifier 70 indicating the resistance state of the selected memory cell 100. Alternatively, the sense amplifier 70 can include circuitry to determine the binary state, and to output the binary state to a processing device (not shown).

The binary state of the selected memory cell 100 can be determined as a change in resistance of the selected memory cell 100 from a high, first value, to a low, second value after a write process. For example, a first, high resistance state results in a low current through the memory cell 100, which can represent a binary state of "0." A second, low resistance state results in a high current through the memory cell 100, and can represent a binary state of "1." This convention, however, is arbitrary, and the assignment of the binary state of "0" can be reassigned to "1," or any other symbolic value. The resistance of the memory cell 100 may be selected to have a "low" value of R if the orientation of the storage element 100 is parallel, and a "high" value of R+ΔR if the orientation is anti-parallel.

In the above read process, the conduction of electrons through the TTJ 116 is described by probability functions. The probability for an electron to tunnel (i.e., pass directly through an insulator layer) is a function of the potentials at each side of the insulator, the thickness of the insulator, and the physical composition of the insulating layer (e.g, $SiO_2$, $Al_3O_2$). When a voltage is applied to the TTJ 116, a tunnel electron current flows through the TTJ 116 according to the probability functions. The ratio of the applied voltage divided by the tunnel current is defined as the tunnel junction resistance. The tunnel current flows through the TTJ 116 when the NMOS transistor control gate 163 of the equivalent circuit 160 is turned ON.

For unselected memory cells 100, the voltage difference between Va and Vd in unselected memory cells 100 should be less than the threshold voltage Vth of the unselected memory cells 100.

If the voltage applied to the column conductor 54 is less than the NMOS transistor threshold voltage Vth, the top surface of the pillar 112 will be depleted of carriers. The action of the NMOS transistor control gate 163 is to disconnect the TTJ resistance 166 at the virtual drain of the NMOS transistor 162 from the low resistance side walls of the NMOS transistor 162. This ensures that little or no sneak path currents flow through the memory cell 100, thereby isolating the memory cells 100.

Figure 7:
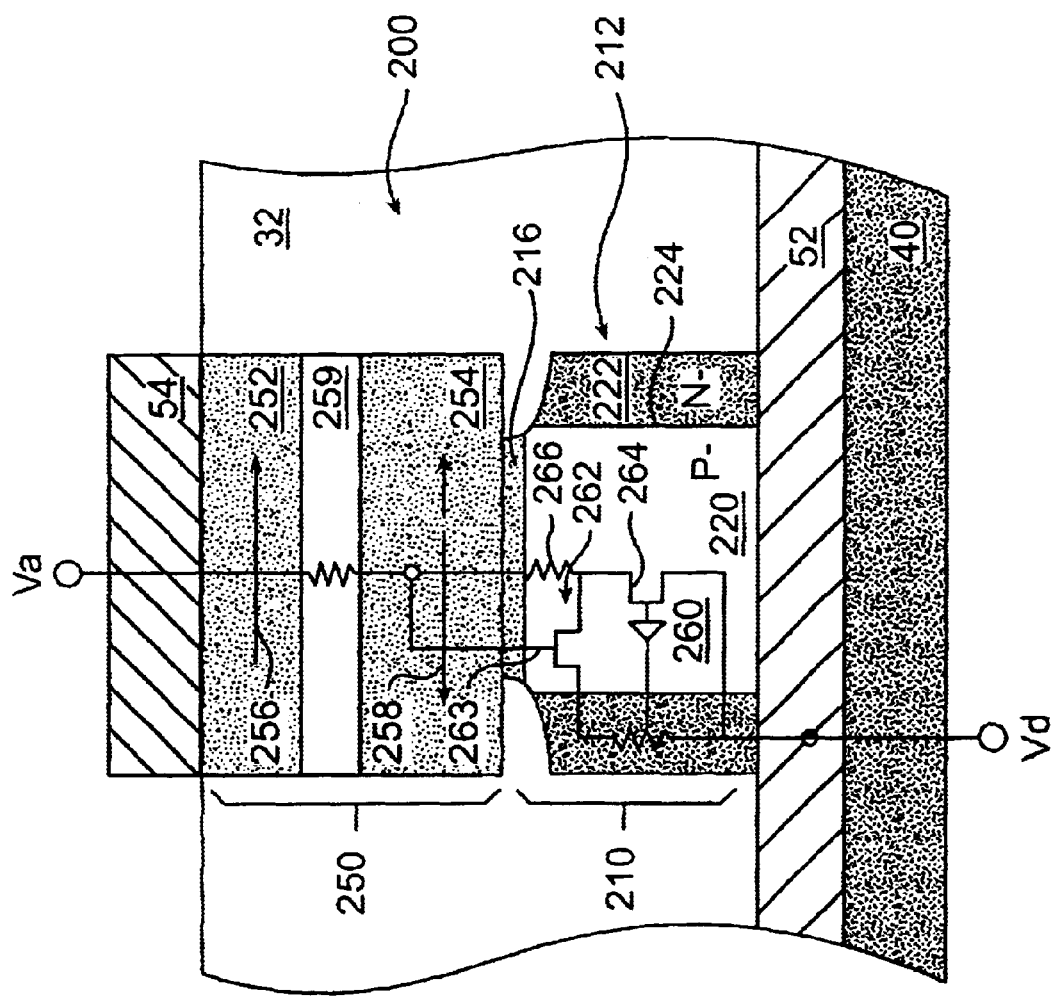
FIG. 7 is a cross sectional view of a memory cell according to a second embodiment, with an equivalent circuit superimposed on the memory cell.

FIG. 7 is a cross sectional view of a memory cell 200 according to a second embodiment, with an equivalent circuit 260 superimposed over the memory cell 200.

The memory cell 200 is similar to the memory cell 100 illustrated in FIGS. 5–6. However, the memory cell 200 includes an isolation element 210 disposed over the row conductor 52, and a storage element 250 disposed over the isolation element 210. The equivalent circuit 260 also operates to isolate the memory cell 200 in a manner similar to the equivalent circuit 160 in the memory cell 100 (FIG. 6). In FIG. 7, like numbers reference elements that are like to elements from FIG. 6, with the numbers in FIG. 7 beginning with "2" rather than "1."

Figure 8:
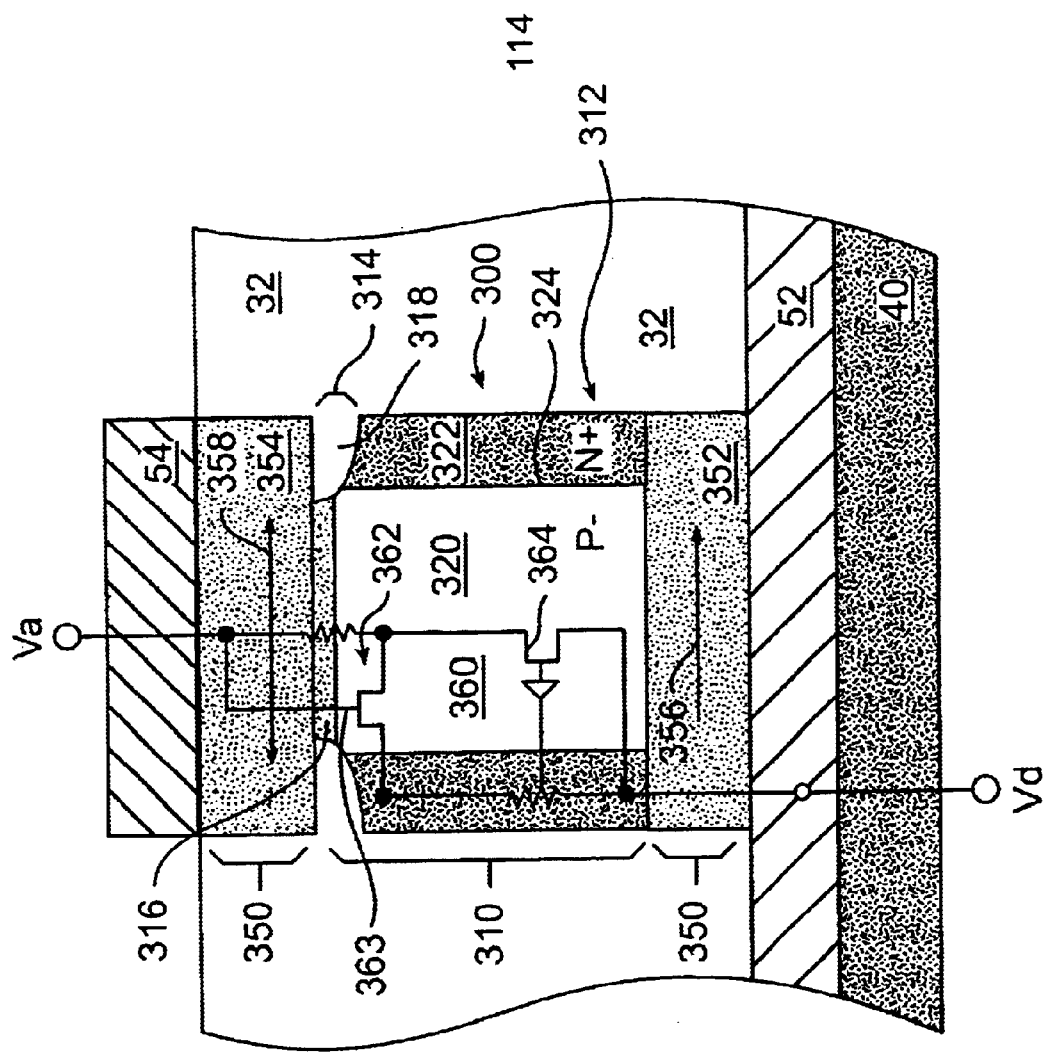
FIG. 8 is a cross sectional view of a memory cell according to a third embodiment, with an equivalent circuit superimposed on the memory cell.

FIG. 8 is a cross sectional view of a memory cell 300 according to a third embodiment, with an equivalent circuit 360 superimposed over the memory cell 300.

The memory cell 300 includes an isolation element 310 that generally corresponds to the isolation element 110 of the memory cell 100 illustrated in FIGS. 5–6. In the memory cell 300, however, the storage element 350 comprises a free layer 354 disposed on one end of the isolation element 310 and a pinned layer 352 disposed on the other end of the isolation element 310. The equivalent circuit 360 operates as in the embodiments illustrated in FIGS. 5–7 to isolate the memory cell 300. The memory cell 300 does not include, however, a separate storage element resistance. In FIG. 8, like numbers reference elements that are like to elements from FIG. 6, with the numbers in FIG. 8 beginning with "3" rather than "1."

Figure 9:
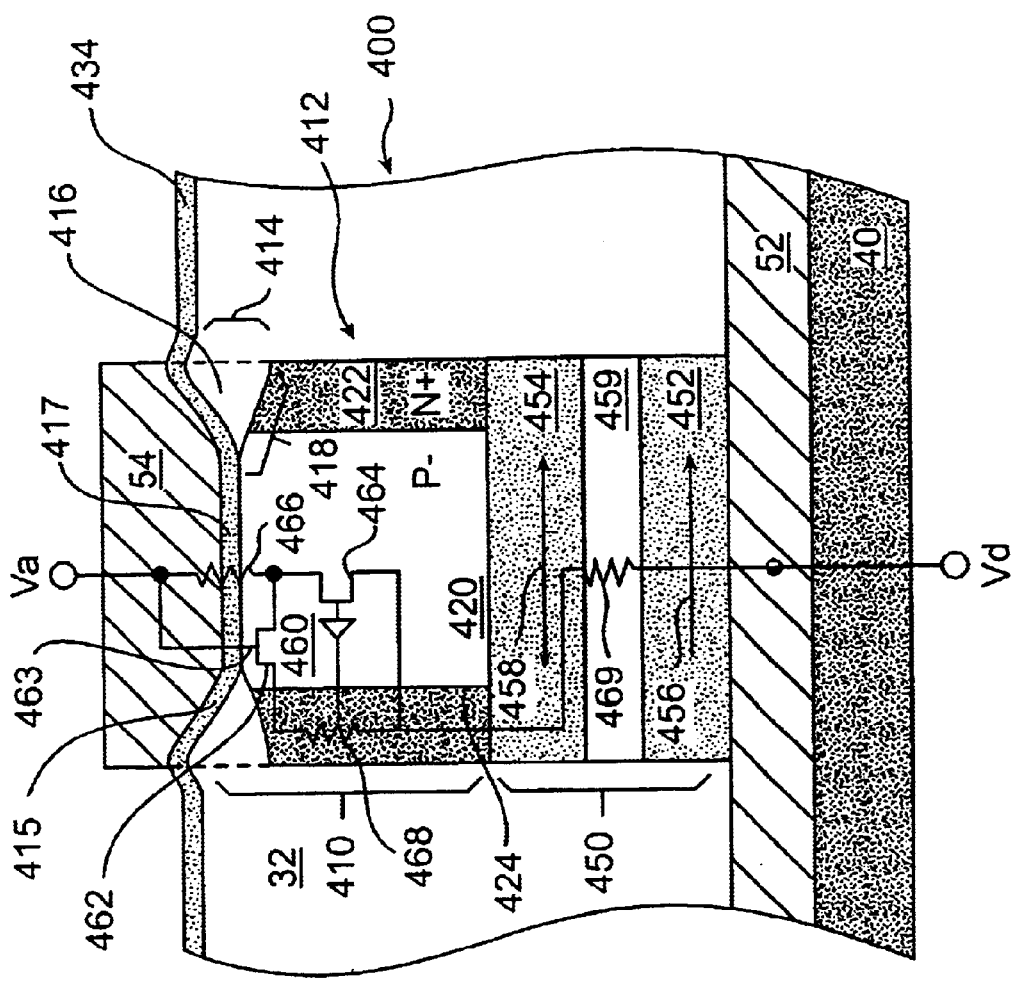
FIG. 9 is a cross sectional view of a memory cell according to a fourth embodiment, with an equivalent circuit superimposed on the memory cell.

FIG. 9 is a cross sectional view of a memory cell 400 according to a fourth embodiment, with an equivalent circuit 460 superimposed over the memory cell 400. The memory cell 400 includes an alternative form of gate oxide.

The memory cell 400 comprises an isolation element 410 and a storage element 450 in series with the isolation element 410. The isolation element 410 serves to isolate the memory cell 400 from leakage currents during read operations, as in the previously discussed embodiments. The memory cell 400 has an alternative gate oxide structure to serve as the control gate for an NMOS transistor function in the isolation element 410.

The storage element 450 can be a re-writeable storage element, such as, for example, an MRAM storage element. The storage element 450 includes a pinned layer 452 and a free layer 454. The pinned layer 452 has a magnetization of fixed orientation, illustrated by the arrow 456. The magnetization of the free layer 454, illustrated by the bidirectional arrow 458, can be oriented in either of two directions along an easy axis of the free layer 454. The free layer 454 and the pinned layer 452 are separated by an insulator 459 that serves as an insulating tunnel barrier layer.

The isolation element 410 isolates the memory cell 400 from sneak path currents, and has the function of a tunnel gate transistor. The isolation element 410 is vertically oriented. The isolation element 410 comprises a pillar 412 and a gate oxide 414 disposed at an end of the pillar 412. As in the previously described embodiments, the gate oxide 414 functions as a control gate for the transistor isolation element 410.

The gate oxide 414 is indicated by dotted lines in FIG. 9. The gate oxide 414 comprises a tunnel gate oxide 415, and a nonuniform gate oxide 416. The tunnel gate oxide 415 may comprise a portion of an oxide layer 434 extending over the insulator 32. A central portion of the tunnel gate oxide 415 is a thin tunnel junction TTJ 417 of the gate oxide 414. The TTJ 417 is disposed over a P– core region 420 of the pillar 412. In an embodiment, the insulator 32, the tunnel gate oxide 415, and the nonuniform gate oxide 416 can be made from the same material. In this case, the gate oxide 414 would be continuous with the insulator 32.

The pillar 412 includes a depleted P– core region 420 and an N+ region 422 surrounding the P– core region 120. The pillar 412 therefore has a diode structure. A PN junction 424 is formed at the boundary between the N+ region 422 and the P– core region 420.

As in previous embodiments, tunneling current is generally limited to a center region of the gate oxide 414. The tunneling current is substantially restricted to the TTJ 417 by the larger thickness of the gate oxide 414 over the N+ region 422. As shown in FIG. 9, an outer region 418 of the gate oxide 414 has the shape of an annulus around the TTJ 417. The thickness of the outer region 418 increases outwardly from the TTJ 417 towards the outer edge of the gate oxide 414, and may appear to have a "bird's beak" cross section. The nonuniform gate oxide 416 forms the bird's beak between the pillar 412 and the tunnel gate oxide 415. The gate oxide 414 therefore has a non-uniform thickness that increases outwardly from the TTJ 417.

The gate oxide 414 functions as a control gate for an NMOS transistor structure in the memory cell 400. The equivalent circuit 460 illustrates this structure and comprises an NMOS transistor 462, an NMOS transistor control gate 463, a JFET 464, a TTJ resistance 466, an N+ region resistance 468, and a storage element resistance 469. The surface of the pillar 412, along with a control gate 463 and the N+ region 422 at the periphery of the pillar 412, forms the NMOS transistor 462.

As in the memory cell 100 illustrated in FIGS. 5–6, the JFET 464 acts as an enhancement mode JFET, with a zero gate-to-source bias, in a non-conduction mode of operation. Current will therefore flow through the TTJ resistance 466 only if the surface of the pillar 412 can be inverted. The surface of the pillar 412 will become inverted if the voltage applied between the column conductor 54 and the row conductor 52 is greater than the threshold voltage Vth of the NMOS transistor control gate 463. A read voltage Vr exceeding the threshold voltage Vth will therefore allow a current to flow through the memory cell 400, so that the binary state of the memory cell 400 can be determined.

Figure 14:
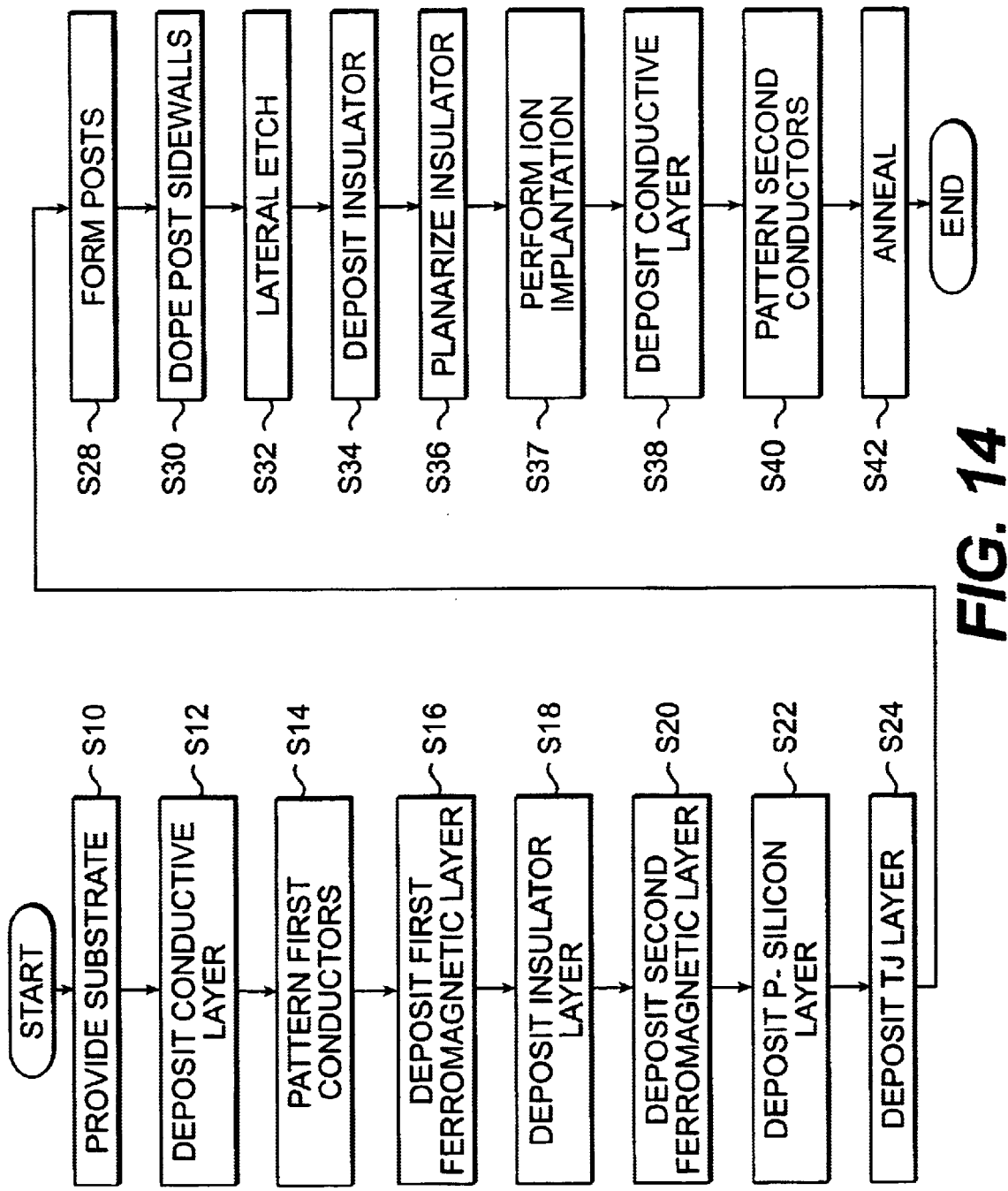
FIG. 14 is a flow chart of the method of making the memory array illustrated in FIGS. 10–13.

FIGS. 10–13 illustrate a fabrication process for the memory array 60 including memory cells 100. FIG. 14 is a flow chart illustrating a method of fabricating the memory array 60. The memory array 60 includes a plurality of memory cells 100, and the described fabrication process may be used to fabricate the memory cells 100, the row and column conductors 52, 54, and other elements of the memory array 60.

Figure 10:
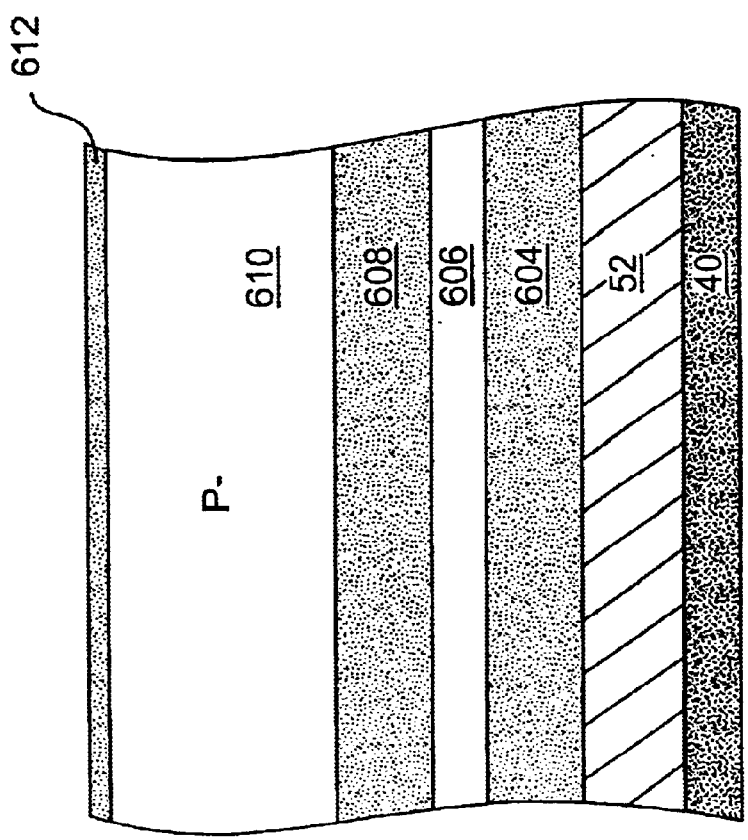

Referring to FIGS. 10 and 14, the process begins with providing the substrate 40 in step S10. The substrate 40 may be, for example, a silicon wafer with a $SiO_2$ upper surface. The silicon substrate 40 can advantageously include support circuitry for memory circuitry to operate the memory array 60. This type of substrate 40 can be, for example, a CMOS integrated circuit. Other types of integrated circuits, such as bipolar, bi-CMOS, NMOS, and SOI circuits can be used. The substrate 40 may contain diffused patterns in a silicon substrate, MOS transistors, PN junction diodes, and polysilicon interconnect layers over inter-level oxide ($SiO_2$) insulation layers. The substrate 40 may also include a layer of silicon dioxide ($SiO_2$) (not illustrated). The layer of silicon dioxide may serve to insulate row conductors from top level conducting layers in the substrate 40, and to provide an insulator material that can be made planar using, for example, chemical-mechanical polishing (CMP) planarization.

In step S12, a conductive layer (not illustrated) is deposited over the substrate 40. The conductive layer may be formed by, for example, a chemical vapor deposition (CVD) process. The conductive layer may be, for example, conductive polysilicon or amorphous silicon. The conductive layer can also be Au, Al, Cu, Ag, other-metals, or alloys thereof, formed by, for example, a sputtering process.

In step S14, first, row conductors 52 are patterned from the conductive layer. The first conductors 52 may be patterned by, for example, photolithography and polysilicon dry etching. The row conductors 52 may alternatively be formed as a diffused layer in the substrate 40, or by a copper damascene process. In a copper damascene process, metal patterns are first defined, and metallic layers are plated over the metal patterns. The metallic layers are finished by a CMP process.

In step S16, a first ferromagnetic layer 604 is deposited over the row conductors 52. The first ferromagnetic layer 604 can be formed by, for example, a process such as low temperature CVD. The first ferromagnetic layer 604 is used to form the pinned layers 152. The first ferromagnetic layer 604 can be formed as multiple layers by any known processes for forming pinned layers in MRAM devices. For example, the layer 604 can comprise a seed layer of NiFe or NiFeCo, an anti-ferromagnetic metallic layer, and a layer of NiFe or NiFeCo disposed over the anti-ferromagnetic layer.

In step S18, an insulator layer 606 is deposited over the first ferromagnetic layer 604. The insulator layer 606 can comprise, for example, Al. The insulator layer 606 can be oxidized by, for example, low temperature oxidation. The insulator layer 606 is used to form the barrier junctions 159 in the storage elements 150.

In step S20, a second ferromagnetic layer 608 is deposited over the insulator layer 606. The second ferromagnetic layer 608 can comprise, for example, NiFeCo, and other ferromagnetic materials, and can be formed by, for example, low temperature CVD.

In step S22, a layer 610 of P– doped silicon is deposited over the entire array in fabrication. The P– layer 610 could also be, for example, amorphous silicon, or polysilicon. The P– layer 610 can be deposited by, for example, low pressure chemical vapor deposition (LPCVD).

In step S24, a tunnel junction layer 612 is deposited over the layer 610. The tunnel junction layer 612 can be, for example, a layer of AlO or $Al_2O_3$ formed by deposition of aluminum and subsequent oxidation of the aluminum. The tunnel junction layer 612 can also be, for example, thin $SiO_2$ or $Si_3N_4$. The tunnel junction layer 612 is used to form the TTJs 116.

Figure 11:
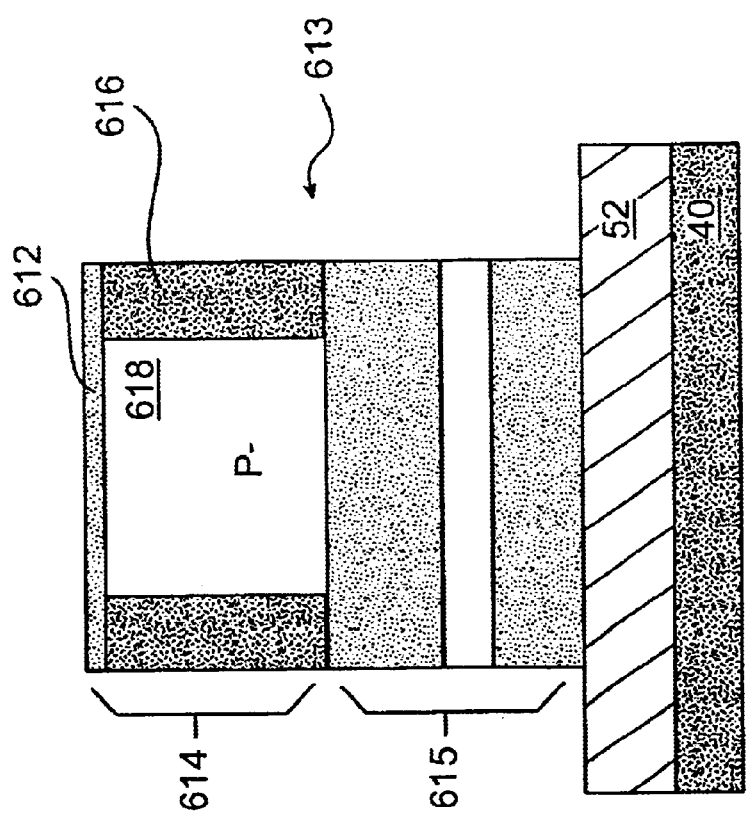

Referring to FIG. 11, in step S28, posts 613 are formed by patterning and etching processes. The patterning process can be performed by photolithography. The patterned areas are etched to form posts 613. The patterns can include, rectangular, round, and other shapes. The posts 613 include a pillar 614 disposed over storage element stacks 615.

In step S30, an N+ dopant is diffused into the sidewalls of the pillars 614. The doping process can be performed by, for example, exposing the pillars 614 to an ambient gas rich in a dopant gas. The dopant gas may be, for example, arsenic gas, phosphorous gas, and other dopant gases. The diffusion process creates an N+ region 616 surrounding a P– core 618. The pillars 614 are selected to have a small enough cross section so that substantially all of the mobile carriers are driven out of the pillars 614 from the resulting contact potential. The contact potential causes mobile holes and electrons to repel, ensuring fully depleted pillars 614. FIG. 11 illustrates the array in fabrication after step S30.

Referring to FIG. 12, in step S32, outer regions 624 of the tunnel junction layers 612 of the pillars 614 are etched by a lateral etch process. The etch process results in thin tunnel junctions 620. The lateral etching removes the portion of the thin tunnel junctions 620 contacting the N+ region 618.

In step S34, a layer of insulator 622 is deposited over the array in fabrication. The insulator 622 fills the space between the posts 613, and fills the outer regions 624. The layer of insulator 622 can be a material having a lower dielectric constant than the thin tunnel junctions 620. The insulator 622 can be made from, for example, $SiO_2$.

In step S36, the upper surface of insulator 622 is planarized using, for example, a chemical mechanical polishing (CMP) process. FIG. 12 illustrates the memory array in fabrication after step S36. In step S37, ion implantation may then be performed in order to create a desired threshold voltage Vth for the NMOS transistor control gate formed by the thin tunnel junction layers 620. Ion implantation is preferably performed using an arsenic species, but other species may be appropriate.

Referring to FIG. 13, in step S38, a conductive layer (not illustrated) is deposited over the planarized surface of the array in fabrication. The conductive layer may be formed by, for example, a CVD process. The conductive layer may be, for example, conductive polysilicon or amorphous silicon. The conductive layer can also be Au, Al, Cu, Ag, other metals, or alloys thereof, formed by, for example, a sputtering process.

In step S40, second, column conductors 54 are patterned from the conductive layer. The second conductors 54 may be patterned by, for example, photolithography and polysilicon dry etching. Metal conductors 54 can be formed by, for example, a copper damascene process.

In step S42, the memory array in fabrication is subjected to an anneal while placed in a magnetic field. The magnetic field sets the magnetization orientations of the storage elements 110. The entire array can be annealed at one time.

A method of manufacturing the memory array 60 including memory cells 400 as illustrated in FIG. 9 will now be discussed with reference to FIGS. 15–19. FIGS. 15–18 illustrate an exemplary fabrication process for the memory array 60 including memory cells 400. FIG. 19 is a flow chart illustrating a method of fabricating the memory array 60. The memory array 60 includes a plurality of memory cells 400, and the described fabrication process may be used to fabricate the memory cells 400, row and column conductors 52, 54, and other elements of the memory array 60.

Figure 15:
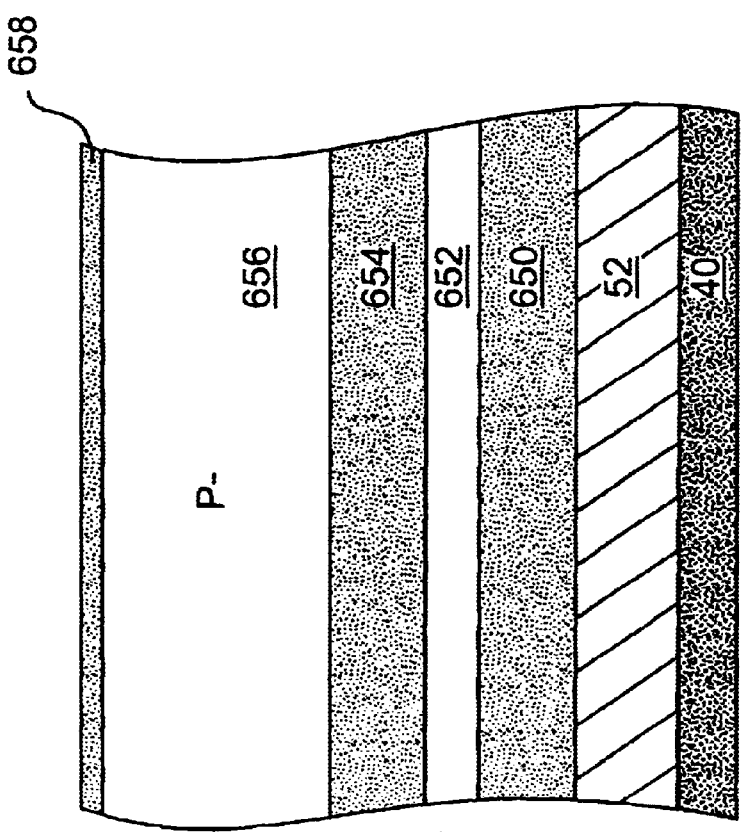

Referring to FIGS. 15 and 19, the process begins with providing the substrate 40 in step S50. The substrate 40 may be, for example, silicon with a $SiO_2$ insulator as a top surface layer. The silicon substrate 40 can advantageously include support circuitry and other support features as recited in step S10 above.

In step S52, a conductive layer (not illustrated) is deposited over the substrate 40. The conductive layer may be formed by, for example, a CVD process. The conductive layer may be, for example, conductive polysilicon or amorphous silicon. The conductive layer can also be Au, Al, Cu, Ag, other metals, or alloys thereof, formed by, for example, a sputtering process.

In step S54, first, row conductors 52 are patterned from the conductive layer. The first conductors 52 may be patterned by, for example, photolithography and polysilicon dry etching. Metal conductors 52 can be patterned by depositing metal layers and etching, or by a copper damascene process. The row conductors 52 may alternatively be formed as a diffused layer in the substrate 40.

In step S56, a first ferromagnetic layer 650 is deposited over the row conductors 52. The first ferromagnetic layer 650, can be formed by, for example, low temperature CVD. The first ferromagnetic layer 650 is used to form the pinned layers 452. The first ferromagnetic layer 650 can be formed of multiple layers by any known processes for forming pinned layers in MRAM devices. For example, the layer 650 can comprise a seed layer of NiFe or NiFeCo, an anti-ferromagnetic metallic layer, and a layer of NiFe or NiFeCo disposed over the anti-ferromagnetic layer.

In step S58, an insulator layer 652 is deposited over the first ferromagnetic layer 650. The insulator layer 652 can comprise, for example, Al. The insulator layer 652 be deposited by, for example, an LPCVD process. The insulator layer 652 can oxidized by, for example, low temperature oxidation. The insulator layer 652 is used to form the barrier junctions 459 in the storage elements 450.

In step S60, a second ferromagnetic layer 654 is deposited over the insulator layer 652. The second ferromagnetic layer 654 can comprise, for example, NiFeCo, and other ferromagnetic materials, and can be formed by, for example, low temperature CVD.

In step S62, a layer 656 of P– doped silicon is deposited over the array in fabrication. The P– layer 656 could also be, for example, amorphous silicon, or polysilicon. The P– layer 656 can be deposited by, for example, an LPCVD process.

In step S64, a thin barrier layer 658 is deposited over the P– layer 656. The barrier layer 658 comprises a material that inhibits or prevents the diffusion of oxygen through the barrier layer. The barrier layer 658 may be, for example, silicon nitride ($Si_3N_4$). FIG. 15 illustrates the array in fabrication after step S64.

Figure 16:
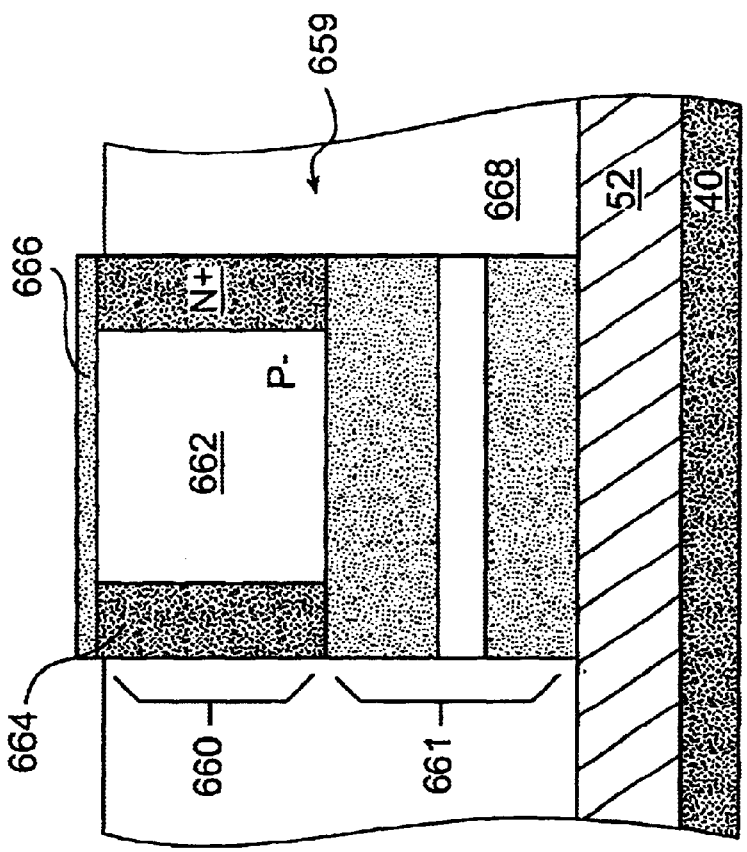
FIGS. 15–18 illustrate a method of making the cross point memory array according to the memory cell embodiment illustrated in FIG. 9.

Referring to FIG. 16, in step S66, posts 659 are formed from layers 650–658 by, for example, patterning and etching processes. The patterning process can be performed by photolithography, and the patterns may include, for example, squares aligned over memory cell locations on the first conductors 52. The patterns can also include rectangular or round shapes. The patterning process results in patterned areas of barrier layer 666 covering the P– silicon layer 656. The patterned areas are then etched. The etching process results in pillars 660 disposed over storage element stacks 661. Each of the silicon pillars 660 is capped with an area of barrier layer 666.

In step S70, an N+ dopant is diffused into the sidewalls of the silicon pillars 660. The doping process can be performed by placing the pillars 660 in an ambient gas rich in a dopant gas. The dopant gas may be, for example, arsenic gas, phosphorous gas, and other dopant gases. The diffusion process creates an N+ region 664 surrounding a P– core 662. The pillars 660 are selected to have a small enough cross section so that substantially all of the mobile carriers are driven out of the pillars 660 by the resulting contact potential. The contact potential causes mobile holes and electrons to repel one another, ensuring fully depleted pillars 660.

The barrier layer caps 666 on the top of the pillars 660 are a barrier to the N+ deposition and diffusion process, preventing a PN junction from forming at the top of the pillars 660.

In step S72, the area between the pillars 660 is filled with a deposited insulator 668 which may be, for example, $SiO_2$, or other insulating materials. The insulator 668 may be deposited by, for example, LPCVD.

In step S74, the insulator 668 is etched back to a level just slightly below the level of the barrier layers 666, so that the edges of the barrier layers 666 and a portion of the N+ regions 664 are exposed. FIG. 16 illustrates the array in fabrication after etching of the insulator 668.

Figure 17:
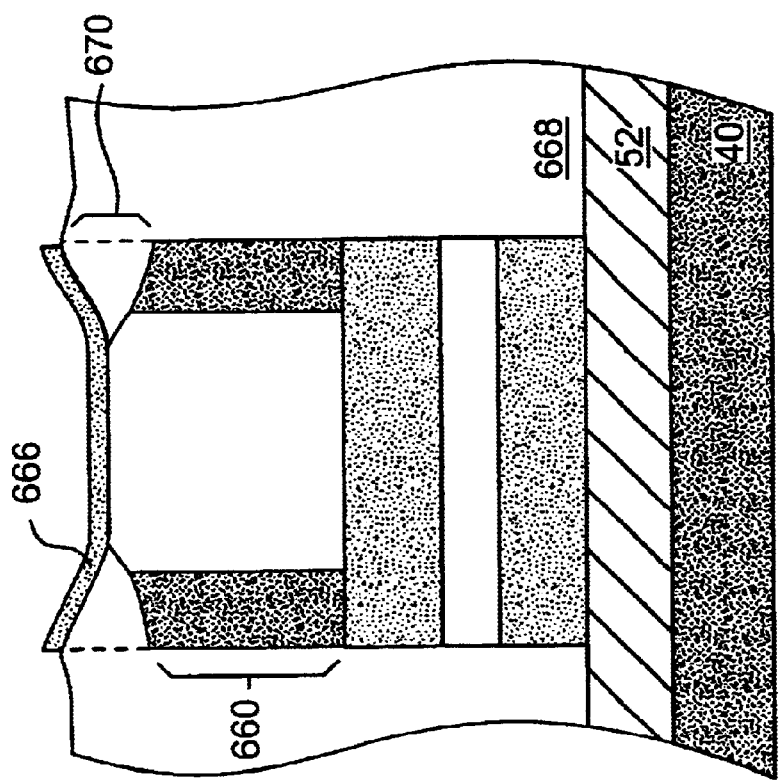

Referring to FIG. 17, in step S76, thermal oxidation is performed. During thermal oxidation, oxygen is placed in the ambient gas at an elevated temperature. During the oxidation process, oxygen diffuses through the insulator 668, to the silicon surface of the pillars 660. At the exposed edges of the pillars 660, the oxidation process occurs rapidly. The oxidation in a pillar 660 changes the silicon of the pillar 660 to silicon dioxide. The barrier layer 666 cap on top of the silicon pillar 660 is a barrier to oxygen and prevents oxidation at the top of the pillar 660. At the top edge of the pillar 660, oxygen diffuses under the barrier layer 666 and reacts with the silicon at the top surface of the pillar 660. This lateral diffusion and oxidation process is limited by the diffusion process, and slows down as it goes deeper into the pillar 660. As the silicon dioxide is formed, it pushes the barrier layer 666 upward. The result of the thermal oxidation process is a non-uniform silicon dioxide oxidation region 670 at the top of the pillar 660.

A cross section of the non-uniform oxidation region 670 is thick at the edge and very thin in the center, and the cross section is said to resemble a "bird's beak." FIG. 17 illustrates the fabrication process after thermal oxidation.

In step S78, the barrier layer 666 used to form the oxidation region 670 is removed by, for example, a wet dip in hot phosphoric acid. The wet dip can be performed without removing an excessive amount of the exposed oxidation region 670.

Figure 18:
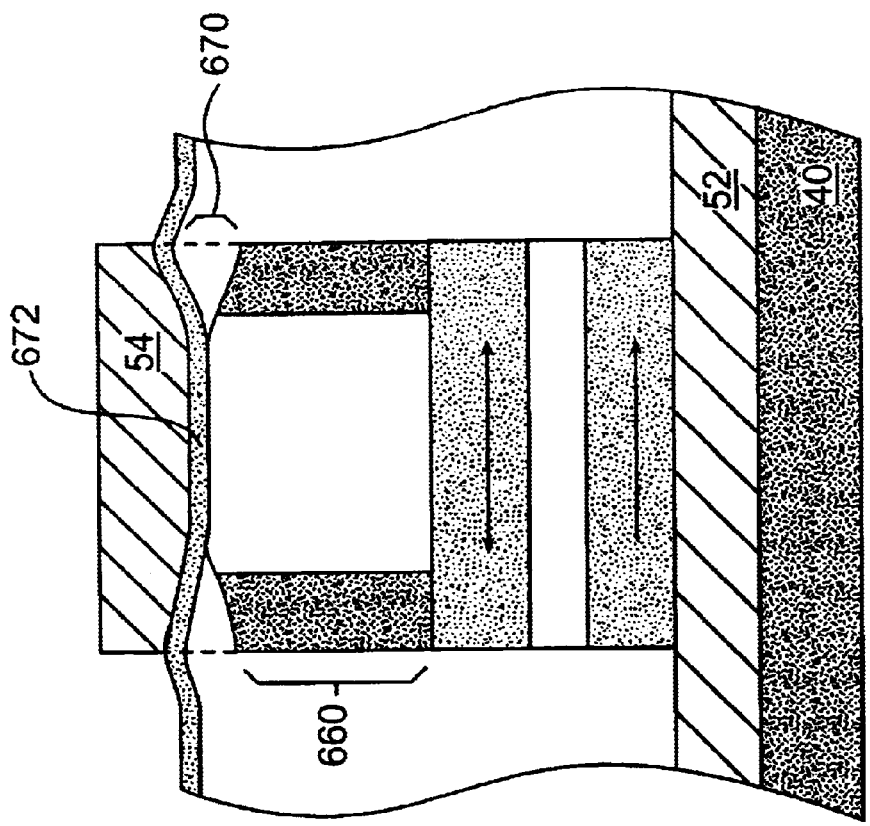
Figure 19:
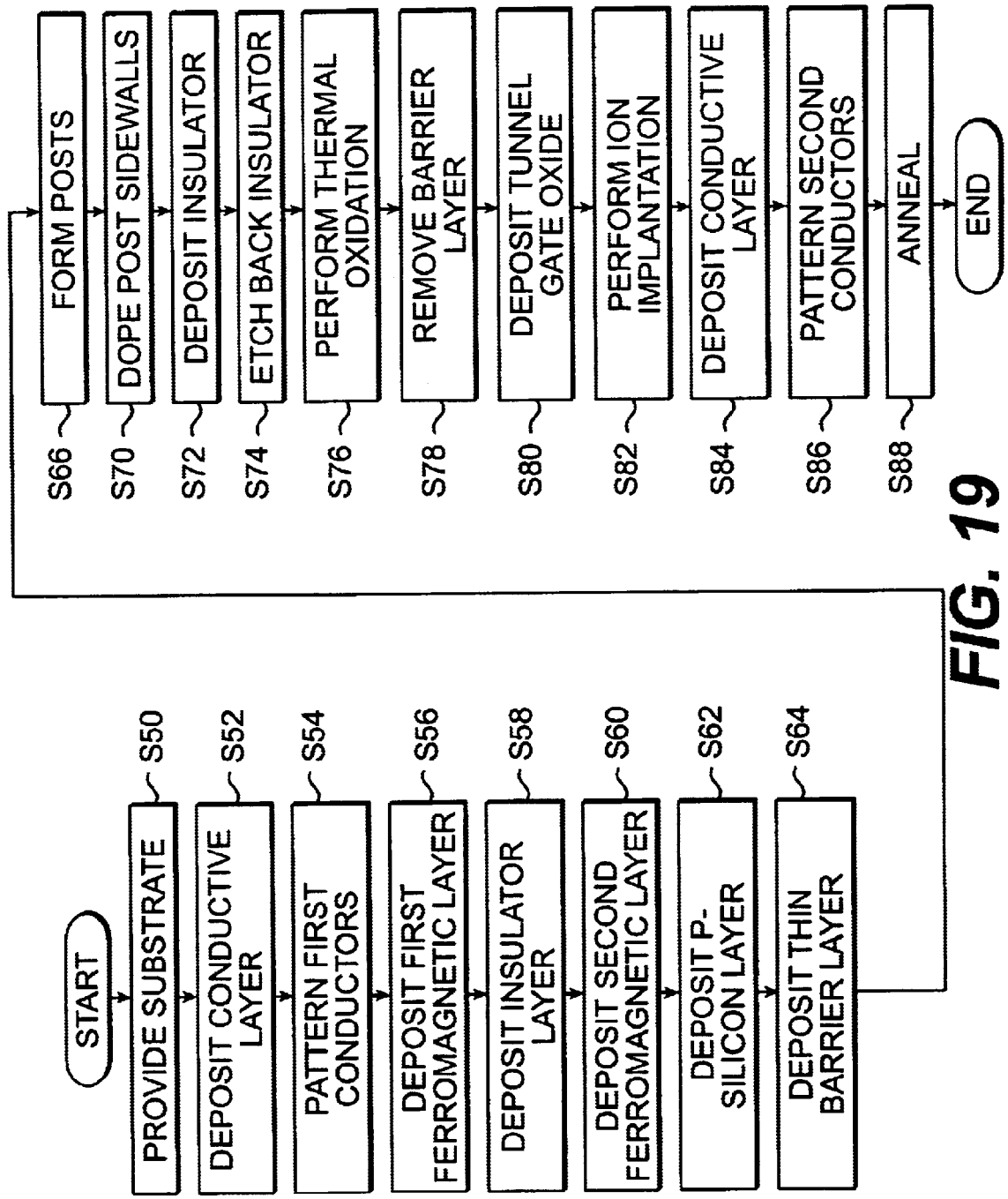
FIG. 19 is a flow chart of the method of making the memory array illustrated in FIGS. 15–18.

Referring to FIG. 18, in step S80, a tunnel gate oxide 672 is deposited over the top of the oxidation region 670. The tunnel gate oxide 672 can be, for example, $SiO_2$, $Al_3O_2$, or other dielectrics. The tunnel gate oxide 672 can be deposited by, for example, depositing a thin layer of aluminum using a LPCVD process, followed by a brief exposure to oxygen to form $Al_3O_2$. The tunnel gate oxide 672 may also be grown by a short thermal oxidation in an oxygen rich ambient to form $SiO_2$. If the tunnel gate oxide 672 is of the same material, such as silicon dioxide, as the oxidation region 670, the two regions will be a continuous layer of silicon dioxide. The tunnel gate oxide 672 may have a relatively uniform thickness of, for example, between 7 and 15 Angstroms.

In step S82, ion implantation is performed on the oxidation region 670 and the tunnel gate oxide 672. Ion implantation is performed in order to create a desired threshold voltage Vth for the NMOS transistor control gate 463 (see FIG. 9). Ion implantation is preferably performed using an arsenic species, but other species may be appropriate. A threshold voltage Vth on the order of 0.5V, for example, can be used as the threshold voltage Vth of the control gate 463. Referring to the completed memory cell 400 illustrated in FIG. 9, the control region of the NMOS transistor 462 is the region of the pillar 412 nearest the PN junction between the N+ region 422 and the P− core 420, under the region where the oxidation region gate oxide 414 varies from thick at the edge of the pillar 412 to very thin at the center of the pillar 412. The ion implantation step forms a threshold adjust layer of, for example, arsenic, to a depth of about 0.05 µm in the pillar 660, which corresponds to the pillar 412.

In step S84, a conductive layer (not illustrated) is deposited over the tunnel gate oxide 672. In step S86, the conductive layer is patterned to form second, column conductors 54. The second conductors 54 can be, for example, Ag, Au, Cu, Al, alloys thereof, and other conductors. A layer of polysilicon can also be used to form the second conductor 54. The polysilicon deposition can be performed by, for example, CVD.

In step S88, the memory array in fabrication is subjected to an anneal while placed in a magnetic field. The magnetic field sets the magnetization orientations of the storage elements 410.

The above fabrication process may employ high temperature processing to diffuse N doping into the sidewalls of the pillar 660, and to grow a non-uniform gate oxide surface structure. A low temperature process may also be used, however. For example, the NP sidewall junction may be a low temperature Schottky junction. In this case, the non-uniform gate oxide surface structure may be constructed using a combination of ion milling, low temperature depositions, and CMP planarization.

In the manufacturing methods described above, the locations of the free and pinned layers in the storage elements may be reversed.

Figure 20:
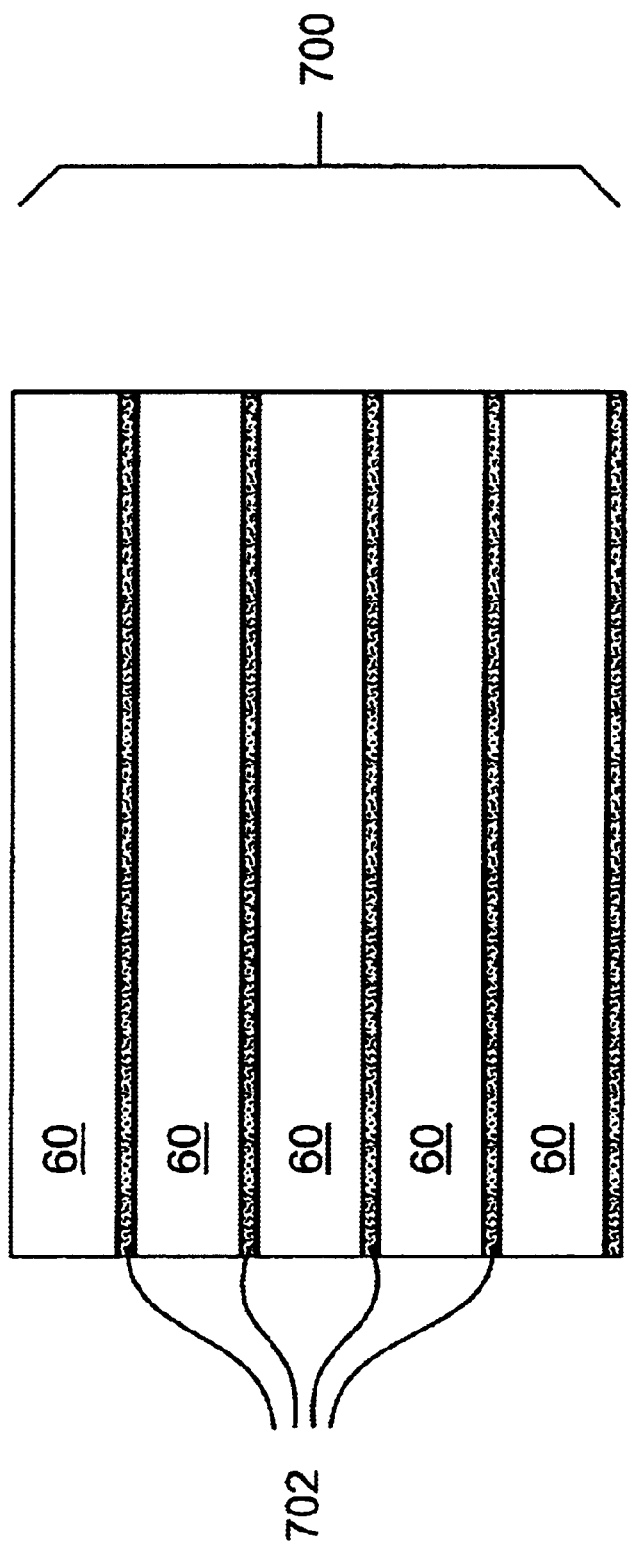
FIG. 20 is a side elevational view of a multi-plane memory array.

The low temperature manufacturing processes discussed above allow multiple memory arrays 60 to be arranged as a stacked memory array. FIG. 20 illustrates an embodiment of a stacked, or "multi-plane" memory array 700.

The multi-plane memory array 700 is a multi-plane memory structure formed from multiple planes of memory arrays 60. The multi-plane memory array 700 can be formed by performing the fabrication methods required to form a first memory array 60, as recited above, and then forming an insulator layer 702 over the finished memory array 60. A subsequent memory array 60 can then be formed over the insulator layer 702. This process can be repeated until a desired number of memory arrays are included in the multi-plane memory array 700.

An alternative embodiment (not illustrated) of a multi-plane memory device can be formed where top conductors of one plane of memory array are used as the bottom conductors for the next plane of multi-plane memory array.

In this specification, the conventions for current flow to write states of "0" and "1" in the memory array are arbitrary, and can be reassigned to fit any desired application of the memory device 50.

In this specification, the terms "row" and "column" do not imply a fixed orientation in a memory array. In addition, the terms "row" and "column" do not necessarily imply an orthogonal relationship.

The sense amplifier 70 illustrated in FIG. 4 is an example of a sensing device for detecting a binary state of a the memory cells in the memory device 50. In practice, other sensing devices, such as a trans-impedance sense amplifier, a charge-injection sense amplifier, a differential sense amplifier, or a digital differential sense amplifier, for example, can be used. One sense amplifier 70 is illustrated in FIG. 3 for sensing the binary state of the memory cells. In practice, a greater number of sensing devices can be coupled to a memory array. For example, a sense amplifier can be included for each column conductor in a memory array, or, a sense amplifier can be included for every two or more column conductors in a memory array.

The memory array 60 can be used in a wide variety of applications. One application may be a computing device having a storage module. The storage module may include one or more memory arrays 60 for long term storage. The storage module can be used in devices such as laptop computers, personal computers, and servers.

While the memory array 60 has been described with reference to the exemplary embodiments thereof, those skilled in the art will be able to make various modifications to the described embodiments of the invention without departing from the true spirit and scope of the invention. The terms and descriptions used herein are set forth by way of illustration only and are not meant as limitations.

What is claimed is:

1. A memory cell, comprising:
    an isolation element, comprising:
        a P− region;
        an N+ region surrounding the P− region, the P− region and the N+ region forming a pillar; and
        a gate oxide disposed at one end of the pillar; and a re-writeable storage element in series with the isolation element.

2. The memory cell of claim 1, wherein the gate oxide comprises:
   a tunnel junction, the tunnel junction contacting the P− region of the pillar.

3. The memory cell of claim 2, wherein a PN junction between the P− region and the N+ region extends through the pillar.

4. The memory cell of claim 3, wherein the re-writeable storage element comprises:
   a first ferromagnetic layer; and
   a second ferromagnetic layer.

5. The memory cell of claim 4, wherein the gate oxide comprises:
   an outer region disposed around a periphery of the tunnel junction, wherein the outer region has a lower dielectric constant than the tunnel junction.

6. The memory cell of claim 4, wherein the gate oxide has a non-uniform thickness.

7. The memory cell of claim 6, wherein the gate oxide has an annular cross section that increases towards an outer edge of the annulus.

8. The memory cell of claim 2, wherein the gate oxide functions as an NMOS transistor control gate.

9. A memory array, comprising:
   a substrate;
   a plurality of first conductors disposed on the substrate;
   a plurality of second conductors, the plurality of second conductors crossing the first conductors at a plurality of cross points; and
   a plurality of memory cells, wherein each memory cell is disposed between a first conductor and a second conductor at a cross point, and wherein a memory cell comprises:
      an isolation element, comprising:
         a P− region;
         an N+ region surrounding the P− region, the P− region and the N+ region forming a pillar; and
         a gate oxide disposed at one end of the pillar; and
      a re-writeable storage element in series with the isolation element.

10. The memory array of claim 9, wherein the gate oxide comprises:
    a tunnel Junction, the tunnel junction contacting the P− region of the pillar.

11. The memory array of claim 10, wherein a PN junction between the P− region and the N+ region extends through the pillar.

12. The memory array of claim 11, wherein the re-writeable storage element comprises:
    a first ferromagnetic layer; and
    a second ferromagnetic layer.

13. The memory array of claim 12, wherein the gate oxide comprises:
    an outer region disposed around a periphery of the tunnel junction, wherein the outer region has a lower dielectric constant than the tunnel junction.

14. The memory array of claim 12, wherein the gate oxide has a non-uniform thickness.

15. The memory array of claim 14, wherein the gate oxide has an annular cross section that increases towards an outer edge of the annulus.

16. The memory array of claim 10, wherein the gate oxide functions as an NMOS transistor control gate.

* * * * *